(12) United States Patent
Bierer

(10) Patent No.: US 6,734,658 B1
(45) Date of Patent: May 11, 2004

(54) WIRELESS ALTERNATING CURRENT PHASING VOLTMETER MULTIMETER

(76) Inventor: Walter S Bierer, 183 Elton Walder Rd., Blythewood, SC (US) 29016

( * ) Notice: Subject to any disclaimer, the term of this patent is extended or adjusted under 35 U.S.C. 154(b) by 0 days.

(21) Appl. No.: 10/117,000

(22) Filed: Apr. 5, 2002

Related U.S. Application Data

(60) Provisional application No. 60/349,574, filed on Jan. 18, 2002.

(51) Int. Cl.[7] .................. G01R 15/08; G01R 13/02; G01R 19/00
(52) U.S. Cl. ................ 324/115; 324/76.55; 324/86; 324/107
(58) Field of Search ................ 324/72.5, 76.52, 324/76.55, 76.82, 86, 107, 115, 127, 149, 108, 114

(56) References Cited

U.S. PATENT DOCUMENTS 4,316,254 A * 2/1982 Levin ................ 702/72
4,799,005 A * 1/1989 Fernandes ............ 324/127

* cited by examiner

Primary Examiner—Ernest Karlsen
(74) Attorney, Agent, or Firm—Timothy J. Slabouz; Nexsen Pruet LLC; Michael A. Mann

(57) ABSTRACT

A wireless alternating current phasing voltmeter multimeter that uses modular wireless based components in order to provide indications of highly desirable parameters of interest, such as AC voltage, phase rotation, and the number of degrees difference between phases. The use of wireless technology eliminates the cable customarily used to interconnect the test probes and the metering circuitry, which may effectively eliminate the concern regarding the distance separating the power lines that are to be tested. The wireless alternating current phasing voltmeter multimeter has two base modules, but, because of the flexibility of the design, modifications can be readily incorporated into the present invention modules that allow for numerous operational and functional permutations to be implemented in order to meet an individual user's needs including the use of one of the modules as a hand-held base module that can be remotely located away from the electrical power lines (or test points).

15 Claims, 8 Drawing Sheets

WIRELESS ALTERNATING CURRENT PHASING VOLTMETER MULTIMETER

CROSS REFERENCE TO RELATED APPLICATIONS

This application claims the benefit of U.S. Provisional Application No. 60/349,574, filed on Jan. 18, 2002, which is in corporated herein by reference. Applicant claims the priority date benefits of that application.

STATEMENT REGARDING FEDERALLY SPONSORED RESEARCH OR DEVELOPMENT

Not applicable.

REFERENCE TO A SEQUENCE LISTING, A TABLE, OR A COMPUTER PROGRAM LISTING COMPACT DISK APPENDIX

Not Applicable.

BACKGROUND OF THE INVENTION

Generally, the present invention relates to multimeters, and, more specifically, to multimeters having functions that may be especially useful to those involved in servicing, maintaining, and/or operating electrical power transmission and distribution systems.

Three-phase electrical power is delivered to commercial, industrial, and residential users through a system known as the power distribution grid, which generally includes such components as generating plants, transformers, and electrical power lines. These lines generally consist of both transmission lines, which typically have AC voltages in the range of about 69,000 to 765,000 volts, and distribution lines, which typically have AC voltages in the range of about 2,300 to 50,000 volts. Inevitably, there is an element of danger in measuring and working with these high voltages, yet there are many instances in which utility workers have to either service or repair, or install or interconnect high voltage power lines in the performance of their duties. These duties have been further expanded over the past few years due to the increase of electrical power co-generation by entities that are not part of, or owned by, the electrical power utility that owns and operates the primary power distribution grid. These co-generation entities, however, still connect to the electrical power utility in most cases, and generally do so at the aforementioned high voltage levels.

Generally, therefore, those individuals working with electrical power lines often find it necessary to be able to determine or measure the following parameters: phase-to-phase, phase-to-ground, ground-to-phase, and zero reference test, voltages associated with those lines, which can range from zero volts to full transmission line voltages; the phase rotation or the phase sequence of the three-phase AC lines; and the number of degrees of separation between any two phases. Currently, many different pieces of equipment are used for determining the above-mentioned parameters. As examples, the absolute voltage carried by a line may be measured by a "high line resistive voltmeter" or a "phasing voltmeter," and the phase sequence (or phase rotation) may be determined by using a phase sequence indicator (or a phase rotation meter) prior to connecting individual lines of multi-phase networks together.

Presently, high-voltage phasing voltmeters use a series connected meter, two test probes, which are basically high-voltage dropping resistors that are housed in an insulated holder, and a connection cable, which is used for connecting the second test probe to the other components. The test probes generally have metal hooks or other fittings on their ends for making good electrical contact with the power lines, and often the meter is mounted to one of the two test probes and oriented so that the electric utility worker can read the voltage displayed on the meter while taking a measurement. Additionally, insulated extension poles, commonly referred to as "hot sticks" may be used to hold and elevate the entire assembly, and in many situations may be required in order to protect the worker from the hazards associated with high-voltage power lines. Generally, the above-mentioned meter may be designed to measure either voltage or current, but, generally, its display will only indicate voltage. One issue when taking AC voltage measurements, however, is the concern that the indicated voltage is not always the true voltage for the four types of voltage measurements listed above. This is especially a concern when taking high-voltage measurements.

High-voltage measurements are plagued with inaccuracies including those stemming from stray capacitive charging currents. At high-voltages, these stray currents emanate from the surface of every component of the measuring device including the connection cable, and other, i.e., additional, currents may be induced by the electromagnetic fields associated with the power lines. The capacitive current is related to the capacitive reactance, Xc, and, depending on the position of the meter and the connection cable with respect to the ground, the magnitude of this impedance can widely range from a very low to a very high value. Under extreme conditions, such as when the connection cable is lying directly on the ground between two pad-mounted transformers, the value of the capacitive reactance can be very low, which can result in the capacitive current equalling or exceeding the measured current and in highly inaccurate meter readings. In other words, it is often the case that the voltage measured by the meter will vary depending on the location of the meter and the cable.

These AC phasing voltmeter inaccuracies, which are generally attributable to capacitive currents, are eliminated in analog and digital devices using an earth ground lead or cable by the design disclosed and described in the commonly owned U.S. patent application Ser. No. 09/766,254, filed on Jan. 18, 2001, which will be referred to herein as "Companion Specification 1," and are eliminated in digital devices that do not require the use of an earth ground lead or cable in the commonly owned U.S. patent application, Ser. No. 60/327,481, filed on Oct. 5, 2001, which is attached hereto and incorporated in its entirety herein by reference, and which will be referred to herein as "Companion Specification 2."

Regardless of the above, there are still other problems with standard phasing voltmeters. On occasion, the electrical power transmission lines are separated by a considerable distance and, even though the alternating current phasing voltmeter disclosed in Companion Specification 1 practically eliminates capacitive currents regardless of the length of the cable, it does not effectively address the problem of the logistics involved in dealing with a long cable, or the problem of having a cable that is not long enough. This problem, however, was addressed and eliminated by the design disclosed and described in a commonly owned U.S. patent application Ser. No. 09/814,993, filed Mar. 22, 2001, which will be referred to herein as "Companion Specification 3."

Other related problems, however, still exist. For example, when measuring very high-voltages there is a difficulty associated with having to use an unwieldy or cumbersome length of dropping resistors and extension pole segments in order to take the high-voltage measurements and/or to determine other electrical parameters. Secondly, due to the hazards associated with the high-voltages being measured, the meter oftentimes has to be kept a considerable distance away from the user. Thirdly, the meter is generally used out of doors during all types of weather and at all times of the day. Because of these constraints, even though accuracy in making the measurements may be accomplished through use of the inventions described in the Companion Specifications, this does not always translate to a user being able to accurately read the meter. In other words, being able to extract the indicated voltage or parameter information is not always easy to do, or can it be done accurately and/or efficiently when using a standard prior art meter.

Thus there remains a need for an alternating current phasing multimeter that can be used without an earth ground lead or cable, can be used over a large range of voltages, can provide other useful information to the user, can be easily and efficiently read, and can be easily used when the power lines are separated by more than a few feet.

SUMMARY OF THE INVENTION

According to its major aspects and briefly recited, the present invention is a wireless AC phasing multimeter, which is comprised of an AC phasing voltmeter, preferably having improved accuracy, and may also include a phase sequence or phase rotation indicator, along with a phase comparison indicator. Furthermore, the present invention can be viewed as a modular device having two primary modules: a meter probe module, which is necessary in every embodiment of the invention; and a supplementary probe module, which is not needed to perform the invention in at least one of the embodiments. Generally, the present invention modules can be used as a wireless AC phasing voltmeter having the capability of providing measurements with an improved accuracy and/or providing additional functions not generally found in, or provided by, standard AC phasing voltmeters. In making the above-mentioned determinations and measurements, two modules of the present invention can be attached to and placed in electrical communication with test probes. These probes are used to make an electrical connection to the electrical power lines or conductors, and, in turn, allow the modules to develop a signal associated with each power line parameter of interest. Preferably, from these signals, the present invention may be able to measure many different parameters including, but not limited to, phase-to-phase, phase-to-ground, ground-to-phase, and zero reference test, voltages associated with those lines. Preferably, these signals also allow the present invention to ascertain phase sequence or rotation, as well as the phase difference between the lines being tested. Once the parameters of interest are ascertained by the present invention, the parameters are preferably displayed digitally on the meter probe module's built-in display, which may be attached to a test probe as described above. However, in another preferred embodiment of the present invention, the meter probe module is not attached to a test probe. Instead, one or two supplementary probe modules are attached, through test probes, to separate power lines and signals are transmitted from each supplementary probe module to a supervisory module (i.e., a meter probe module that is not attached to a test probe and, therefore, may be hand-held) where they are received and displayed by the supervisory module. This is especially useful when working with high-voltage lines in that, for example but not as a limitation, the length of dropping resistors and the insulated extension pole segments needed to drop the voltage to a usable level, i.e., in order to protect the user (e.g., utility worker), can be considerable and unwieldy, and can cause the measuring device to be a considerable distance away from the user. Therefore, the present invention multimeter not only can be applied to power lines that are a considerable distance apart without being limited by a test probe interconnection cable, but the present invention also allows the parameters of the high-voltage power lines being tested to be accurately read by bringing each display and/or indicator closer to the user in these situations while providing the related advantage of eliminating the need for the long, unwieldy, length of dropping resistors and insulated pole segments. The present invention phasing voltmeter multimeter includes a pair of high impedance test probes, each of which is in series with a communication circuit and in series or in communication with circuitry that is used for determining the electrical parameters of interest and displaying the results of such determinations.

The probes and circuitry of the phasing voltmeter multimeter may be shielded, and the shielding may be electrically connected to the components and/or the circuitry of the present invention in order to alleviate the effects of capacitive charging currents. Relatedly, and preferably, the present invention does not require the use of an earth ground lead or cable. However, other embodiments, for example, those used for measuring voltages in the range of 0–25 kV, may be used with an earth ground cable or lead. In addition to the above-mentioned components, signal phase shift compensation may be used to compensate for phase shifts that may occur in the present invention due to radiative transmission and reception of the signals used to determine the parameters of interest. Preferably, this compensation may be accomplished through the use of hardware and/or software within the modules; however, any other suitable method may also be used.

An important feature of the present invention is the use of an electromagnetic radiation communication means for transmitting and receiving the signals. This feature has several advantages. First, it eliminates the cable, which, in addition to the cost and the need to manage and maintain the cable as part of a standard AC phasing voltmeter, also imposes a significant physical limitation on the distance between the two probes. In other words, the present invention allows the taking of voltage, and/or phase sequence, and/or difference measurements between two power (e.g., transmission and/or distribution) lines that may be located very far apart. Third, it reduces the natural trepidation of workers who are making measurements on electrical power lines carrying very large voltages. And, while any electromagnetic waves (visible, infra-red, radio-frequencies, or microwave, for example) can be used, radio frequencies are preferred because they allow for other objects to be in the line-of-sight between the transmitter and the receiver without an appreciable loss of signal. Furthermore, it is preferable that the signals are transmitted digitally and in such a way as to minimize the effects of electrical noise on the transmission, such as by frequency shift keying, but other known transmission methods can be used as well.

Another feature of the present invention is that it is possible to retrofit a standard AC phasing voltmeter with the communication means of the present invention instead of using a connection cable. For example, in one embodiment, supplementary probe modules, i.e., signal transmitters, are attached to the power lines (or electrical test points) of interest and are used to send signals to a supervisory module, i.e., a receiver, which is attached to a standard AC phasing voltmeter.

Still another feature of the present invention is the optional inclusion of wireless signal compensation to eliminate wireless signal errors, which could allow for more accurate readings.

Still another feature of the present invention is the use of modular components, which allows the user more flexibility in the manner in which the measurements are taken and displayed, and which allows for the incorporation of optional features.

These and other features and their advantages will be apparent to those skilled in the art of electrical power line measuring equipment design, service, operation, and maintenance from a careful reading of the Detailed Description of the Invention, accompanied by the drawings.

DETAILED DESCRIPTION OF THE INVENTION

Figure 3A:
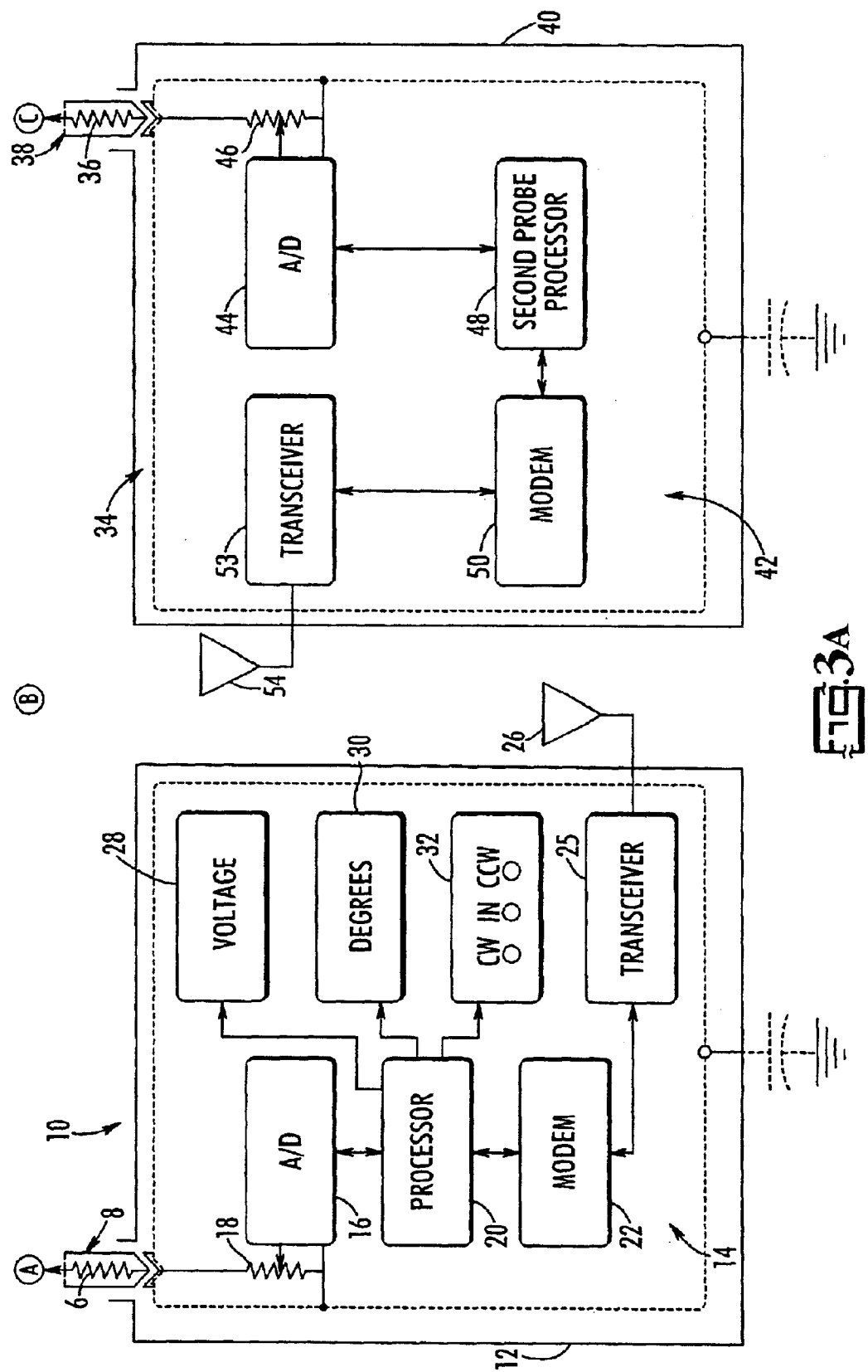
FIG. 3A is a block diagram of the AC phasing voltmeter multimeter, according to a preferred embodiment of the present invention.

The use of the terms "processor" or "CPU" in any of their forms herein, should be construed to encompass the myriad of processing devices currently available, or which may become available in the future. For example, but not as a limitation, the processors and/or CPUs described herein, for use in the present invention, may include, but are not limited to: a "microprocessor," which is basically an entire CPU on a single chip and commonly referred to as a "microprocessor unit," and, if used with a power supply, memory and a clock, it would work like a computer; a "microcontroller," which is also known as a "computer on a chip," and is generally defined as: a single chip that contains the processor, RAM, ROM, clock and the I/O control unit; an "ASIC" ("Application Specific Integrated Circuit"), which is a chip that is custom designed for a specific application rather than a general-purpose chip such as a microprocessor; an "embedded system" which is basically a specialized computer for use in a specialized application and which may either use an embedded Operating System or have the Operating System and the specialized application combined into a single program; and a "Digital Signal Processor," which is a programmable CPU that is used for making analog to digital and/or digital to analog conversions and that includes fast instructions sequences commonly used in such conversion applications. Additionally the "processors" and/or "CPUs" may be configured to use a "master-slave" communication protocol. As shown in FIG. 3A, for example, but not as a limitation, the Meter Probe Processor 20 may initiate and control the communications with the Supplementary Probe Processor 48, which will respond to the Meter Probe Processor's 20 commands; in this case, the Meter Probe Processor 20 could be considered as a "master processor" while the Supplementary Probe Processor 48 could be considered as a "slave processor."

The present invention is an AC phasing voltmeter multimeter that is an improvement over existing phasing voltmeters. Preferably, the AC phasing voltmeter multimeter can be used to make measurements over the large range of AC voltages encountered by many electric power company workers, and may be used to provide an indication of phase-to-phase, phase-to-ground, ground-to-phase, and zero reference test, voltages; making this invention especially suitable for use with electrical power lines having high AC voltages including, but not limited to, multi-phase power lines. Furthermore, the present invention may include, but is not limited to, a phase sequence or phase rotation indicator, along with a phase comparison indicator, which could provide an indication of the number of degrees difference between phases of the voltage (or current) waveforms carried by the conductors being tested. Preferably the present invention employs some, if not all, of the electrical circuits found in the Companion Specifications 1–3, including, but not limited to, at least one of the voltage measurement accuracy improving circuits of Companion Specification 1 and/or Companion Specification 2, and the present invention may also include, but is not limited to, the communication means described in Companion Specifications 3. Companion Specifications 1 through 3 have been identified above, and all of which are attached hereto and are hereby incorporated herein by reference in their entirety. Generally, Companion Specification 1 is for a multi-range AC phasing voltmeter that provides compensation for capacitive currents; Companion Specification 2 is for a digital AC phasing voltmeter that includes a circuit that compensates for capacitive currents while not requiring the use of a earth ground lead or cable; and Companion Specification 3 is for a wireless AC phasing voltmeter that describes both an analog and a digital embodiment, but both generally require the use of an earth ground lead or cable for proper operation.

Figures 1A, 1B, 1C:
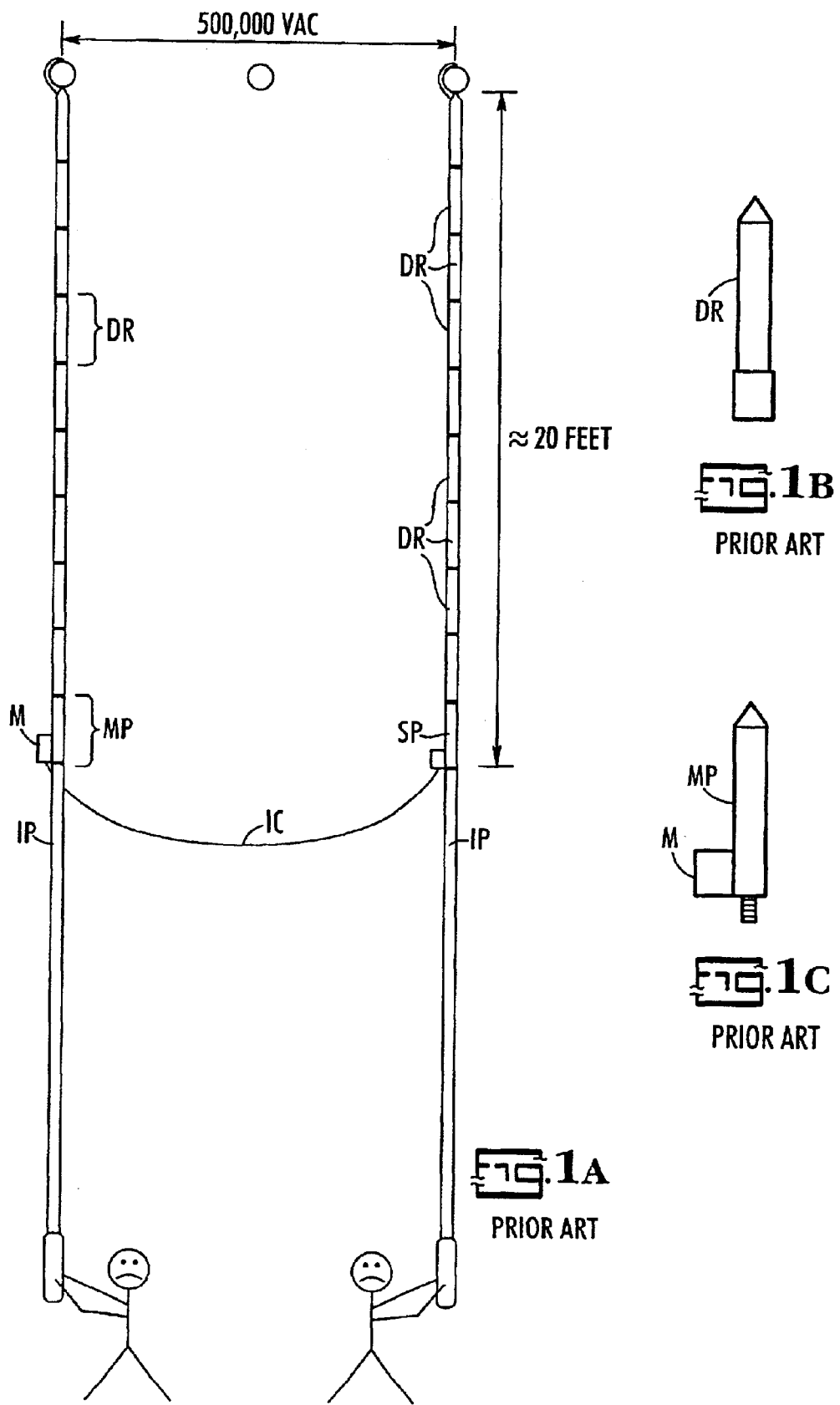
FIGS. 1a–1c an illustration of the prior art AC voltage measuring system.
Figure 2:
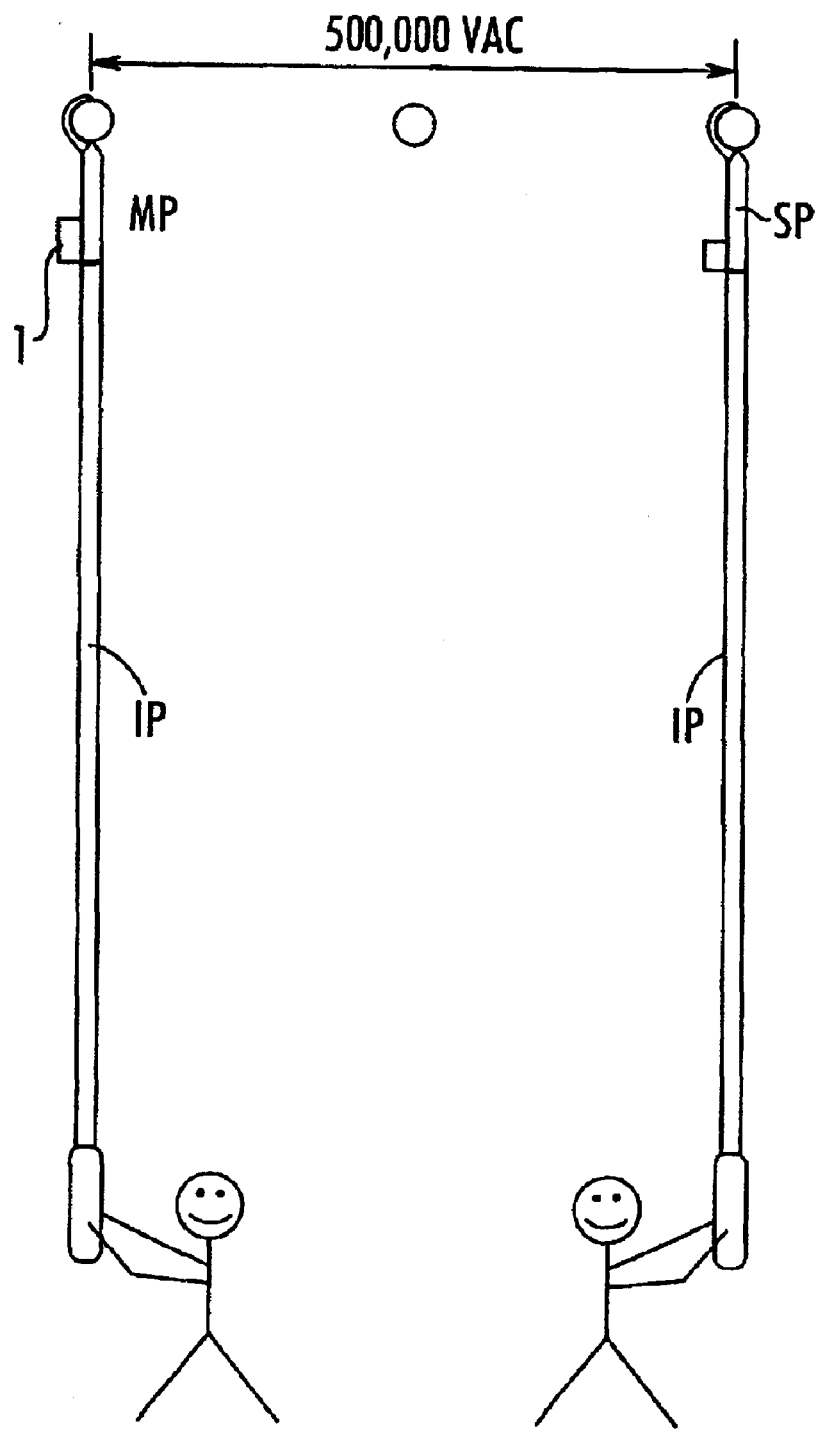
FIG. 2 is an illustration of the present invention showing the difference between the prior art and a preferred embodiment of the present invention.

Referring now to the figures, FIGS. 1a–1c illustrate use of a prior art conventional AC phasing voltmeter, which is configured to measure the AC voltage on a 500,000 VAC line. Generally, as shown, when making this high-voltage measurement, in order to safely dissipate the heat and to drop the voltage to a usable level prior to the meter, approximately twenty feet of dropping resistors DR must be used with both the first probe FP and with the second probe SP. Moreover, because an interconnection cable IC is used between the meter M and the second probe SP, as shown, the interconnection cable will be energized to a line-to-ground voltage level of about 289,000 VAC and, because of this, safety considerations will require the entire conventional metering apparatus of the prior art to be kept away from the user, e.g., utility worker, by an additional twenty feet, for a total distance between the user and the meter of about forty feet. This causes the conventional phasing meter and its associated measuring equipment to be very unwieldy and nearly impossible to control. On the other hand, FIG. 2 shows, through the use of a much simpler configuration, how the very same measurements can be obtained through the wireless AC phasing voltmeter multimeter of the present invention. As shown, the present invention still uses a first probe FP and a second (or supplementary) probe SP, but instead of using a conventional meter M, which requires the use of an interconnection cable IC and the use of dropping resistors DR, as shown in FIGS. 1a–1c, the present invention, through the use of a wireless meter probe module 1 and a wireless supplementary probe module 2, eliminates, or at least significantly curtails the use of dropping resistors DR.

Preferably, both the wireless meter probe module 1 and the wireless supplementary probe module 2 contain wireless communication means that may include an antenna, a modem (or a separate modulator, for use in any of the wireless supplementary probe modules 2, 34, 102 or 103, and/or a separate demodulator, for use in any of the wireless meter probe modules 1, 10, 60 or 100) and, a receiver (for use with any of the wireless meter probe modules 1, 10, 60, or 100) and a transmitter (for use with any of the wireless supplementary probe module 2). In other embodiments, instead of using a receiver and a transmitter, the wireless communication means includes transceivers for use in any of the wireless meter (or supervisory) probe modules and/or any of the wireless supplementary probe modules. These modifications are possible because any suitable wireless communications method (and/or system) that employs the use of radio frequencies or any other form of electromagnetic radiation to communicate information can be used as the communication means of the present invention. For example, a miniature radio frequency transceiver including, but not limited to, Linx Corporation's model #TR-916SC-PAI can be used in either or both of the wireless meter probe module 1 and/or the wireless supplementary probe module 2. However, and preferably, a miniature radio frequency receiver is used in the wireless meter probe module 1 including, but not limited to, a Linx Corporation model RXM-916-ES and/or a miniature radio frequency transmitter is used in the wireless supplementary probe module 2 including, but not limited to, a Linx Corporation model TXM-916-ES. In other words, the present invention is not limited to the above-described combinations of components, and any other suitable combination of communication components that would be able to send and receive the signals necessary for determining the parameters of interest, e.g., AC voltages, phase sequence and/or the phase difference between different phases of a multi-phase system, could be used as well.

Figure 3B:
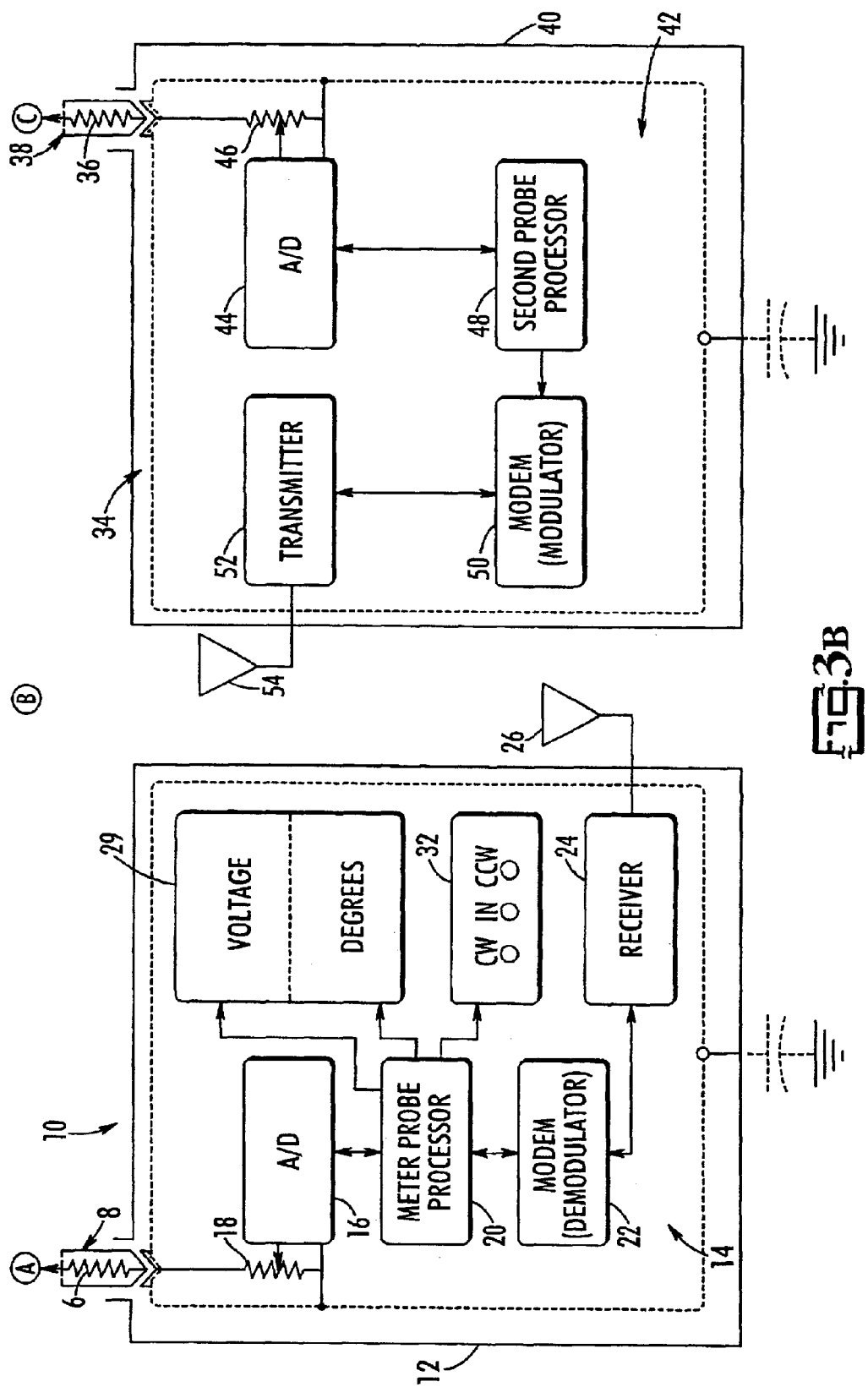
FIG. 3B is a block diagram of the AC phasing voltmeter multimeter, according to another preferred embodiment of the present invention.

Referring now to FIGS. 3A and 3B, a block diagram of an embodiment of the present invention is shown. As shown, the present invention is being used to measure the voltage difference between conductors A and C of an energized, three-phase AC system, and it is also being used to determine the phase difference and the phase sequence of these conductors. Preferably a first high impedance resistor 6 is located in a first probe 8, and both are either incorporated into, or removably attachable to, the meter probe module casing 12. The circuitry 14 associated with the meter probe module 10 is carried within the casing 12 of the meter probe module 10, and it is electrically connected to said first high impedance resistor 6. Preferably the meter probe module 10 and/or the meter probe module circuitry 14 comprise: an analog-to-digital converter 16, which samples the signals from the conductor being tested by tapping the electrical information off of a meter probe module voltage-dropping resistor 18; a Meter Probe Processor 20; a communication means, which, preferably, is comprised of a meter probe module modem 22 (which may be just a demodulator), a meter probe module receiver 24 (or a meter probe module transceiver 25), and a meter probe module antenna 26; a dual-display assembly 29, which is preferably digital (or, alternatively, a voltage display assembly 28 and/or a phase difference display assembly 30); and a phase sequence indicator assembly 32. Also shown in FIGS. 3A and 3B is the supplementary probe module 34. Preferably a second high impedance resistor 36 is located in a supplementary probe 38, and both are either incorporated into, or removably attachable to, the supplementary probe module casing 40. The circuitry 42 associated with the supplementary probe module 34 is carried within the casing 40 of the supplementary probe module 34, and it is electrically connected to the second high impedance resistor 36. Preferably the supplementary probe module 34 and/or the supplementary probe module circuitry 42 comprise: a supplementary probe module analog-to-digital converter 44, which samples the signal from the conductor being tested by tapping the electrical information off of a supplementary probe module voltage-dropping resistor 46; a Supplementary Probe Processor 48; and a supplementary probe module communication means, which, preferably, is comprised of a supplementary probe module modem 50 (which may be just a modulator), a supplementary probe module transmitter 52 (or a supplementary probe module transceiver 53), and a supplementary probe module antenna 54. Relatedly, while any electromagnetic waves, for example, visible light, infrared, radio frequencies, and/or microwaves, can be used by the communication means, radio frequencies are preferred because they allow for other objects to be in the line of sight between the communication components, e.g., the antennas 26 and 54, without an appreciable loss of signal. Furthermore, it is preferable that the signals are transmitted digitally and in such a way as to minimize the effects of electrical noise on the transmission, such as by frequency shift keying, but other well-known signal transmission methods can be used as well. Optionally, but preferably, wireless signal compensation hardware and/or software may be used with the communication means and/or the processing software to correct for a wireless signal errors. Moreover, as previously mentioned, any suitable communication means configuration can be used including, but not limited to, also having a configuration that uses either a transmitter or a receiver in one of the modules, and a transceiver in the other module.

The analog-to-digital converters 16 and 44 are well known devices that convert continuously varying analog signals, i.e., the electrical parameter signals obtained from the voltage-dopping resistors 18 and 46, into binary code for use by the Meter Probe Processor 20 and the Supplementary Probe Processor 48 respectively. The analog-to-digital converters 16 and 44 are preferably used to perform standard "digital signal processing" and may be contained on a single chip, or can be an individual circuit within a chip, and may be used in combination with a digital signal processor. Preferably, the Meter Probe Processors, the Supplementary Probe Processors, the analog-to-digital converters, the digital-to-analog converters, the metering equipment, the displays, the multimeter casing, the test probes and the shielding, come from a group of devices and components that are commonly available or can be fabricated using commonly available knowledge and/or technology in the field of electronics, electrical metering equipment design, and/or other related fields, and all of the common devices and components mentioned herein are fabricated and/or assembled by using standard methods and/or procedures.

For example, a Microchip Corporation processor, model # PIC16C72, may be used to provide most, if not all, of the processing and/or converter requirements for the present invention.

The "processors" and/or the "CPUs" are used for processing and/or analyzing the digitally converted electrical signals obtained from the communication means and/or the voltage-dropping resistors 18 and 46, and then for providing signals corresponding to the parameters of interest to the dual-display assembly 29 (or to a separate voltage display 28 and phase difference display 30), and/or to the phase sequence indicator assembly 32. In an alternative embodiment, (not shown herein, but which is shown in Companion Specification 3), an analog voltage display assembly is used to display the measured voltages, in which case, the Meter Probe Processor 20 would send an appropriate signal to a digital-to-analog converter, which, in turn, sends a processed output signal to the analog (voltage) display assembly in order to provide a visual indication of the measured voltage.

As previously mentioned, the Meter Probe Processor 20 and the Supplementary Probe Processor 48 (and/or the other processors/CPUs described herein) can be configured to use the well-known "master-slave" communication technology, i.e., communications are initiated and controlled by the "master" and the "slave" responds to the "master's" commands. For example, instead of using a receiver 24 in the meter probe module 10 and a transmitter 52 in the supplementary probe module 34, either or both of the modules 10 and/or 34 can use a transceiver 25 and/or 53. Primarily because of the savings in costs, weight, and/or size, however, the use of a receiver in one module 10 and/or 100, and a transmitter in the other module 34, 102, and/or 103, is preferable where appropriate. Whenever conventional "master-slave" communication protocol is not being used, however, the synchronization of communications between the modules may be required for some applications. This could be accomplished by manually synchronizing the modules, by automatically synchronizing the modules through a unidirectional "handshake," or by some other suitable alternative means.

Besides the dual-display 29 being used to provide an indication of voltage and phase difference, the present invention may use a separate voltage display 28 and/or phase difference display or indicator 30 to provide a display or indication of the phase difference between the power lines or conductors being tested. This display function is accomplished through the use of standard, commonly available in the field circuitry and/or devices that are able to process output signals from the Meter Probe Processor 20 and/or 62 and then provide a visual indication and/or display of the determined phase difference. As an example, but not as a limitation, the display, Model #AND491WGST from the AND Corporation can be used to provide the dual-display, or just the voltage display function. Also, the present invention may include a phase sequence or phase rotation indicator. This portion of the present invention is generally referred to as the phase sequence indicator assembly 32, and its function is to provide a display and/or indication of whether the voltage and current waveforms associated with the conductors, e.g., power lines, (illustratively labeled herein as A, B, and C), are effectively rotating in a clockwise manner, i.e., BAC, or a counter-clockwise manner, i.e., ABC. Generally this function is accomplished through the use of standard, commonly available in the field circuitry and/or devices that are able to process output signals from the Meter Probe Processor 20 and then provide a visual indication and/or display of the determined phase sequence, such as for example, but not as a limitation, the LED circuit shown in FIG. 6.

The following description is an example, but not a limitation, of one of the operational uses of the present invention. In operation, the first probe 8 is used to detect the voltage and the other parameters of interest from conductor A of a three-phase power transmission system having conductors A, B, and C. A high impedance resistor 6 is used to drop the voltage, and a second, preferably adjustable, resistor 18, which is electrically tied to shielding, is used to drop the voltage still further. The voltage across the meter probe module voltage-dropping resistor 18 is converted from an analog signal to a digital signal by analog-to-digital converter 16 and is then fed to the Meter Probe Processor 20. The Meter Probe Processor 20 manages the flow of digital data from two sources, the analog-to-digital converter 16 and, preferably, a modem 22, which may just be a demodulator, and processes the signals from these two sources and forwards them for indication and/or for the display of the parameters of interest on display 29 (or 28 and 30), and indicator 32.

A supplementary probe 38 is connected to a supplementary probe module 34, and, like the meter probe module 10, the supplementary probe module 34 also contains communication means that, during operational use, should be within the operational communication range of the communication means used with the meter probe module 10. This range is dependent on a variety of conditions including, but not limited to, the output power of the transmitter 52 (or transceiver 25 or 53) and the sensitivity (and/or the selectivity) of the receiver 24 (or transceiver 25), which leads to the possibility of producing a full-line of embodiments from lower power and less sensitive (and/or selective) models to higher power and/or more sensitive (and/or selective) models to meet a wide range of user's needs. The supplementary probe 38 detects the voltage signal carried by conductor C and drops that voltage across a high impedance resistor 36 and the supplementary probe module voltage-dropping resistor 46. As with the meter probe module voltage-dropping resistor 18, the supplementary probe module voltage-dropping resistor 46 is tied electrically to shielding, which may be capacitively connected to earth ground. An analog-to-digital converter 44 converts the analog voltage dropped across the voltage-dropping resistor 46 to a digital signal and then passes it to a Supplementary Probe Processor 48. The digitized signal from the Supplementary Probe Processor 48 is then transmitted to the communication means of the meter probe module 10, preferably, by using a modem 50, which may just be a modulator, and a transmitter 52 (or transceiver 53), and an antenna 54. The digitized signal may be transmitted by frequency modulation, amplitude modulation, phase modulation, or by frequency shift keying, the last of these being preferred and all of which are well known techniques for transmitting digital signals. The use of radio frequencies is convenient and makes it possible to transmit through or around obstacles that might hinder line-of-sight transmissions such as visible light, infra-red and possibly microwave transmissions. However, these other forms of electromagnetic waves could also be used. Also, the use of frequency shift keying is preferred because of its resistance to noise, but amplitude modulation, phase modulation, and/or any other suitable technique may be used as well. The signal transmitted by the supplementary probe module 34 is received by the antenna 26 and is forwarded to the Meter Probe Processor 20 via a receiver 24 (or a transceiver 25)

and a modem 22, which may just be a demodulator, which is used to demodulate the signal. The signals are then processed by the Meter Probe Processor 20 to extract the parameters of interest, and are then directed to the display 29 (or the displays 28 and 30), and/or the indicator 32, or, alternatively, the signals may be converted back to analog, by a digital-to-analog converter (as shown and described in Companion Specification 3), for analog display.

As previously mentioned, some embodiments of the present invention may allow for the use of grounding cables or leads, which may be attached to optional connectors that can be incorporated into, or onto, the various modules. As an example, it may be preferable to use grounding leads when an excessive number of dropping resistors are not required and the meter can be used much closer to the user, e.g., when the present invention is being used to measure voltages in the range of 0–25 kV.

Figure 4:
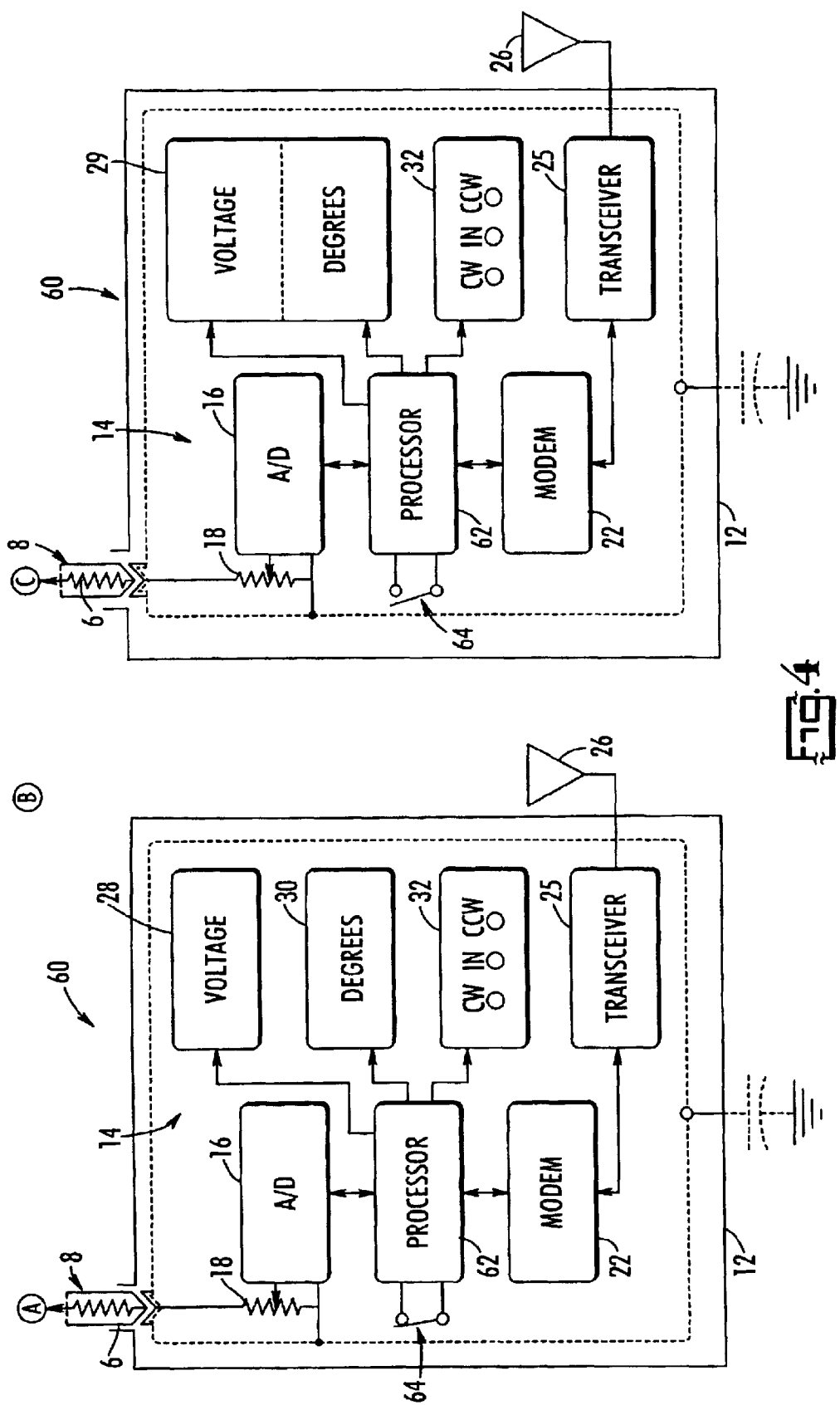
FIG. 4 is a block diagram of the AC phasing voltmeter multimeter, according to an alternative preferred embodiment of the present invention.

Referring now to FIG. 4, another preferred embodiment of the present invention is shown. As shown, instead of using one meter probe module 10 and one supplementary probe module 34, two modified meter probe modules, referred to herein as universal modules 60, are used. In this embodiment, except for several differences that will be described below, all of the previously described components of and/or associated with the meter probe module 10 may be used in and/or with the universal module 60. With respect to the differences, the Universal Processor 62 of this embodiment may be configured to function as the previously described Meter Probe Processor 20 and/or as a Supplementary Probe Processor 48. This is dependent on whether the user selects the universal module 60 to perform the functions of the previously described meter probe module 10 or the supplementary probe module 34. The user makes this selection through the use of a selector switch 64 located on the universal module 60, as shown in FIG. 4. Once this selection is made, the universal module 60 selected to be the supplementary probe module 34 will effectively emulate a supplementary probe module 34 as previously described, and the universal module 60 selected to be the meter probe module 10 will effectively emulate a supplementary probe module 34 as previously described. Preferably, in order to prevent operator confusion, the indicators and/or displays on the universal module 60 selected to emulate a supplementary probe module 34 can be made inoperative and may only provide a visual indication of it being in supplementary probe module mode. Preferably, the modules 60 used in this embodiment will use a transceiver 25 and a full modem 22 in its communication means; however, any other suitable communication configuration can also be used including, but not limited to, those previously described herein (or in a Companion Specification). Also, preferably, the dual-display 29 used in this embodiment will be able to display both voltage and phase degree difference; however, any other suitable display configuration can be used as well, including, but not limited to separate displays for voltage 28 and phase degree difference 30.

Figure 5:
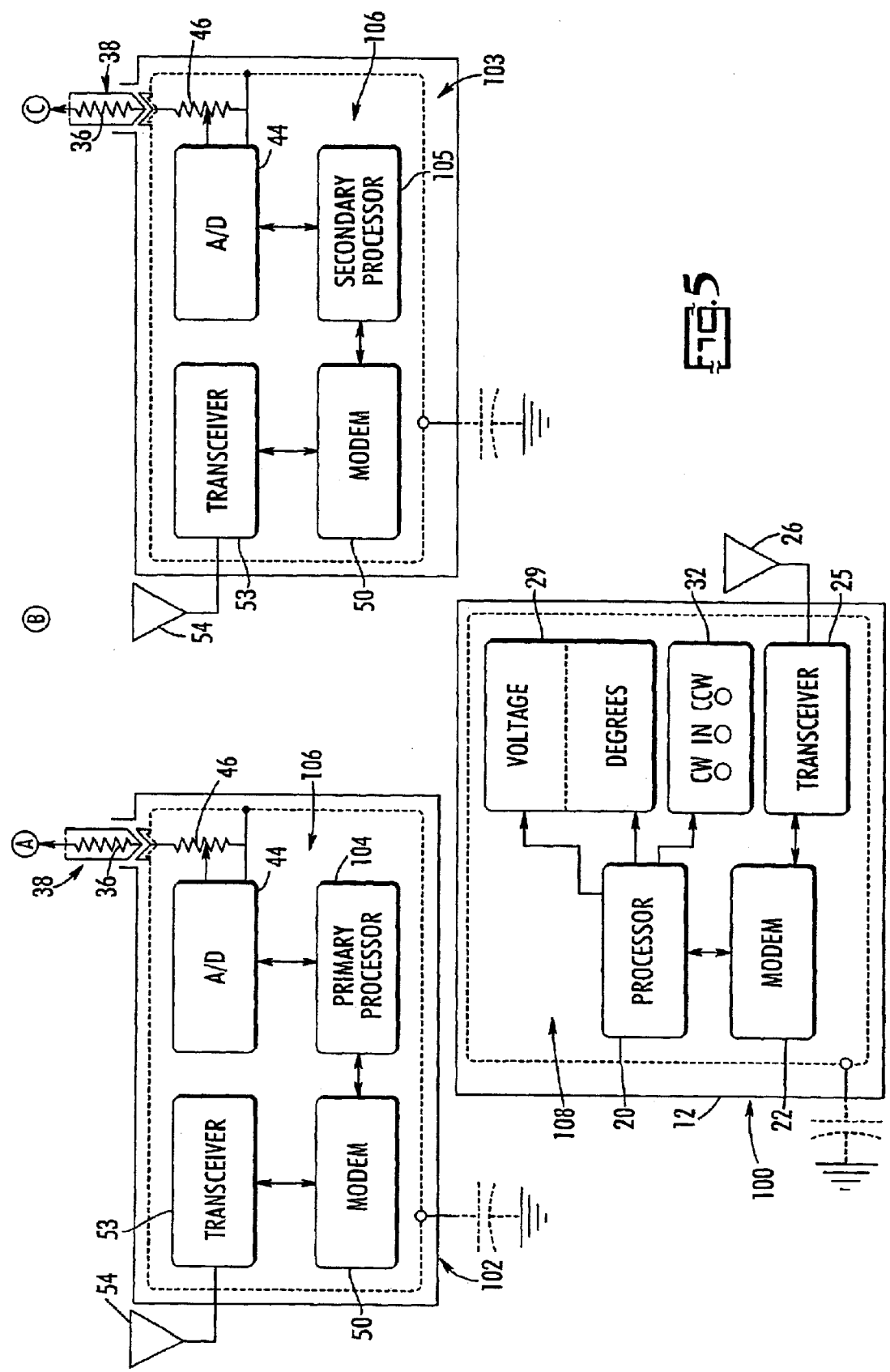
FIG. 5 is a block diagram of the AC phasing voltmeter multimeter, according to another alternative preferred embodiment of the present invention.

In another preferred embodiment, as shown in FIG. 5, a stand-alone meter probe module is used as a supervisory module 100, i.e., the supervisory module 100 is not connected to a first probe 8 or a supplementary probe 38. Furthermore, this embodiment uses two supplementary probe modules 102 and 103 and supplementary probe module circuitry 106 to obtain and transmit, and analyze, the parameter information, and, while standard supplementary probe modules 34 may be used with this application, the modules 102 and 103 and/or circuitry 106 may be modified within the scope of this and the Companion Specifications to meet communications, display, and/or other requirements, as necessary. Generally all of the components used in the modules, of this embodiment, operate as previously described, e.g., the supervisory module 100 and its circuitry 108 and associated components operate in a manner similar to the manner previously described for a meter probe module 10, and the two supplementary probe modules 102 and 103 and their circuitry 106 and associated components operate in a manner that is similar to the manner previously described for a supplementary probe module 34. However, since two supplementary probe modules 102 and 103 are being used, the processors can be respectively designated as a Primary Processor 104 and a Secondary Processor 105, and the communications protocol and/or the processor timing may be modified, as needed, to synchronize the three processors 20, 104, and 105. Preferably this synchronization is accomplished through the use of different identification frequencies by each of the modules 102 and 103; however, any other well-known means for establishing the communication links between the modules can be used. Additionally, as with the other embodiments, the different configurations including, but not limited to, those using capacitive current compensation, and/or those described with the other embodiments herein (or in the Companion Specifications), if appropriate, can be used in or with this embodiment as well.

Figure 6:
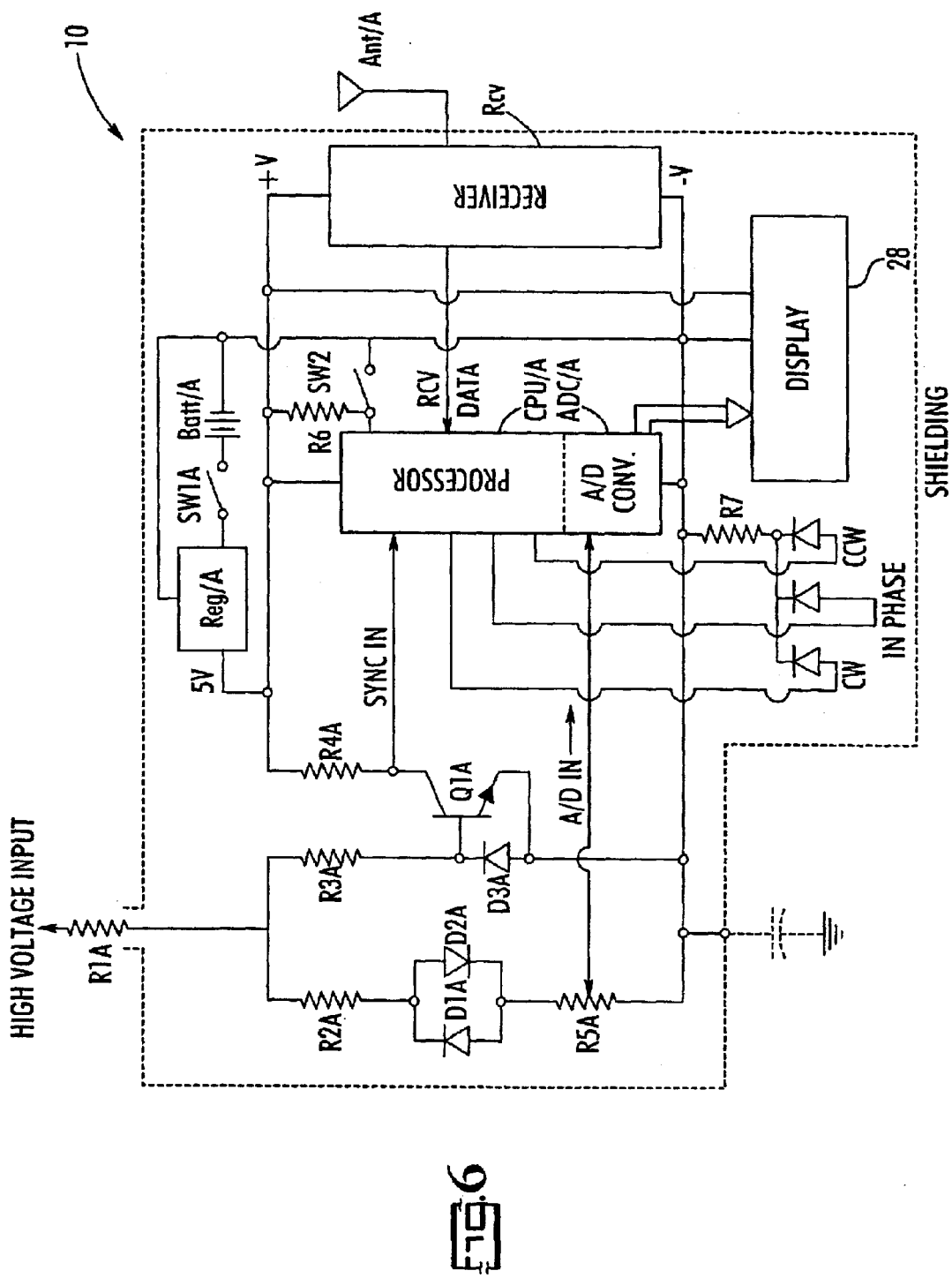
FIG. 6 is a schematic diagram of the meter probe module circuitry, according to a preferred embodiment of the present invention.
Figure 7:
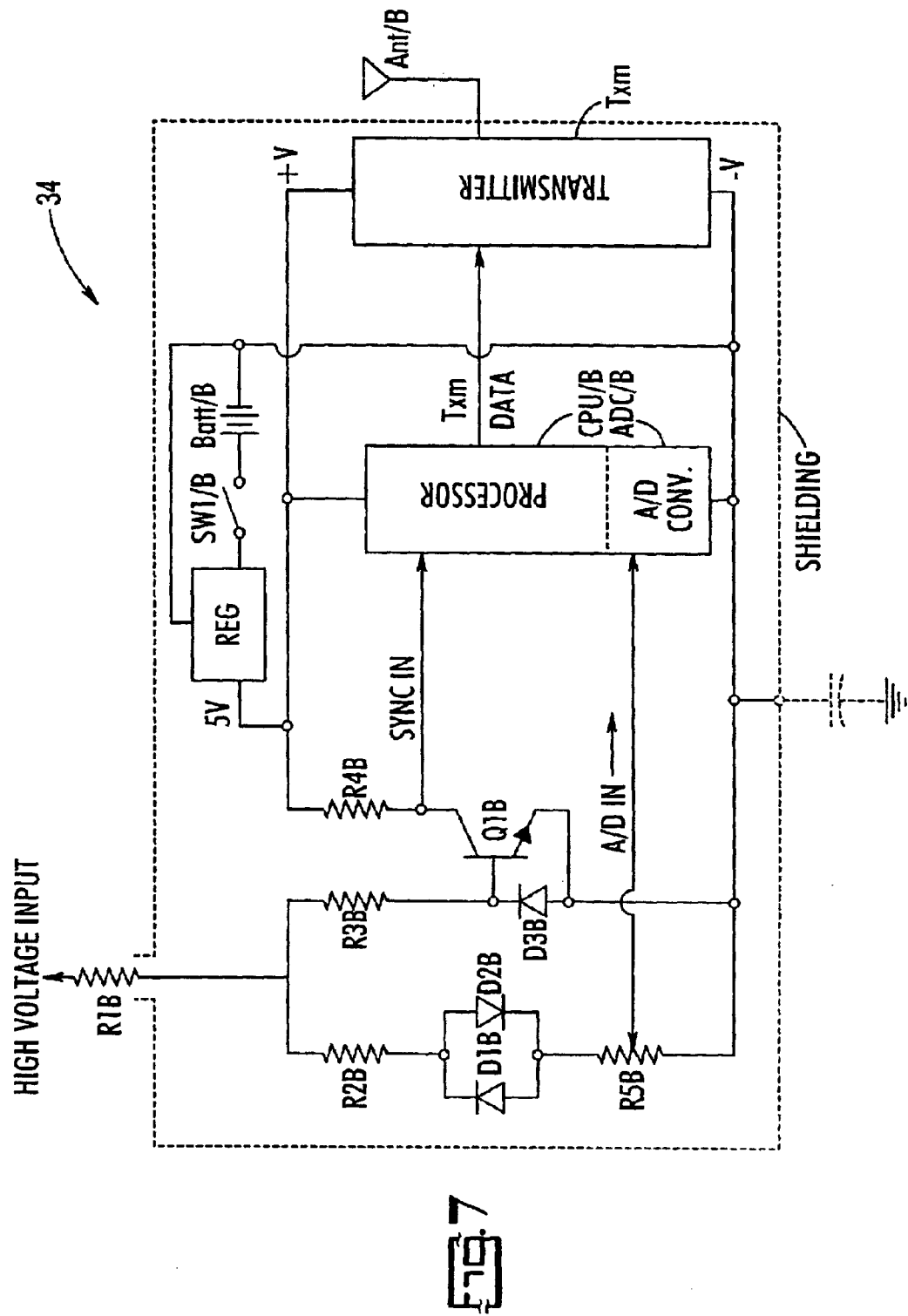
FIG. 7 is a schematic diagram of the supplementary probe module circuitry, according to a preferred embodiment of the present invention.

Referring now to FIGS. 6 and 7, schematic diagrams of the preferred embodiments of the meter probe module circuitry 14, the supervisory module 108 if not using a transceiver 25, and the supplementary probe module circuitry 42, including supplementary probe circuitry 106 if not using a transceiver 53, are shown. As shown, the high-impedance high-voltage dropping-resistors R1A and R1B and the module casings 12 and 40 are shielded, and the high-voltage dropping-resistors R1A and R1B as well as the circuitry 14 and 42 are electrically connected to the shielding.

Referring to the meter probe module 10 shown in FIG. 6, operationally and/or functionally, the high-voltage dropping-resistor R1A, is a high impedance device that is used to drop the voltage from the source being tested to a usable level prior to the electrical signal reaching the meter probe module 10 and the meter probe module circuitry 14. Additionally, as shown, the meter probe module circuitry 14 uses resistors R2A and R5A, and diodes D1A, D2A, to form a voltage divider and an impedance matching network for the analog to digital converter ADC/A, with the electrical signal being specifically directed to the analog to digital converter ADC/A from R5A. The meter probe module circuitry 14 also uses resistors R3A and R4A along with a diode D3A and a transistor Q1A as another voltage divider, and as a wave-shaping network to provide timing and synchronization pulses for use by the processor CPU/A. Also included in the meter probe module 10 and/or the meter probe module circuitry 14 is: a voltage regulator Reg/A, which is used as a power supply for the processor CPU/A and which is a conventional device designed to maintain a voltage level of about 5 vdc; a meter probe module 10 on-off switch Sw1/A; a 9 vdc battery Batt/A; a microprocessor CPU/A; an antenna Ant/A; a 916 MHz receiver Rcv; a display select circuit comprising a resistor R6 and a display select switch Sw2, which is used for selecting whether the voltage or the phase difference in degrees is displayed on the built-in dual-display 29; and a phase sequence circuit comprising a resistor R7 and three light emitting diodes: CW, which indicates that the phases being tested are rotating clockwise, i.e., BAC; CCW, which indicates that the phases being tested are rotating in a counter-clockwise direction, i.e., ABC; and IN PHASE, which indicates that the phases being tested are in-phase.

Similarly, a supplementary probe module 34 is shown in FIG. 7. Operationally and/or functionally, the high-voltage dropping-resistor R1B, is a high impedance device that is used to drop the voltage from the source being tested to a usable level prior to the electrical signal reaching the supplementary probe module 34 and the supplementary probe module circuitry 42. Additionally, as shown, the supplementary probe module circuitry 42 uses resistors R2B and R5B, and diodes D1B, D2B, to form a voltage divider, and an impedance matching network for the analog to digital converter ADC/B, with the electrical signal being specifically directed to the analog to digital converter ADC/B from R5B. The supplementary probe module circuitry 42 also uses resistors R3B and R4B, along with a diode D3B and a transistor Q1B as another voltage divider, and as a wave-shaping network to provide timing and synchronization pulses for use by the processor CPU/B. Also included in the supplementary probe module 34 and the supplementary probe module circuitry 42 is: a voltage regulator Reg/B, which is a used to act as a power supply for the processor CPU/B and which is a conventional device designed to maintain a voltage level of about 5 vdc; a supplementary probe module 34 on-off switch Sw1/B; a 9 vdc battery Batt/B; a microprocessor CPU/B; an antenna Ant/B; and a 916 MHz transmitter Tmx.

Additionally, well known means for allowing a large range and/or multiple ranges of voltage measurements to be made and displayed can be incorporated into the present invention. Preferably this can be accomplished by commonly available means such as automatic ranging circuitry, which will cycle through the available ranges until the proper voltage range is found for the conductors or lines being tested, or the range can be selected by a manual selector switch similar to the switch described in Companion Specification 1; however, any other suitable means or method can be used.

While some of the modules described herein are devices that are generally self-contained, i.e., permanently attached to their respective first probe and/or supplementary probe, this is for illustrative purposes only and should not be viewed as limiting the number of embodiments that the present invention can take. In other embodiments of the present invention, for example, the meter or supplementary probe modules may have jacks and/or connectors that allow it to easily attach to a standard high impedance resistor and probe assembly, and other connectors, which can be used to attach the meter or supplementary probe modules to a separate standard insulated pole or "hot stick," or to a ground lead or cable. Similarly, the meter probe module's communication means and some or all of the meter probe module's circuitry may be embodied as separate optional components that may incorporate jacks and/or connectors that will allow these components to be retrofitted to and/or used with a standard AC phasing voltmeter. Also, while use of the present invention is generally described with reference to the probes being attached to separate conductor it should be noted that one probe could be attached to one conductor (e.g., power line) and the other probe could be attached to either the same conductor or electrical ground in order to take measurements and/or to make electrical parameter determinations.

Finally, it will be apparent to those skilled in the art of electrical power transmission line servicing and maintenance equipment design, (and/or other related fields), that many other modifications and substitutions can be made to the foregoing preferred embodiments without departing from the spirit and scope of the present invention. The preferred embodiments and the best mode of the present invention are described herein. However, it should be understood that the best mode for carrying out the invention hereinafter described is by way of illustration and not by way of limitation. Therefore, it is intended that the scope of the present invention includes all of the modifications that incorporate its principal design features, and that the scope and limitations of the present invention are to be determined by the scope of the appended claims and their equivalents.

What is claimed is:

1. A device for use in measuring voltage, phase rotation, and phase difference between two electrical test points, said device comprising:
    (a) a supplementary test probe adapted to generate a supplementary electrical signal;
    (b) a supplementary probe module attachable to said supplementary test probe, said supplementary probe module having
        (i) means for producing a digital representation of said supplementary electrical signal, and
        (ii) means for transmitting said digital representation of said supplementary electrical signal using electromagnetic waves;
    (c) a first test probe in operational communication with said supplementary test probe and adapted to generate a first electrical signal; and
    (d) a meter module attachable to said first test probe, said meter module having
        (i) means for producing a digital representation of said first electrical signal,
        (ii) means for receiving said digital representation of said supplementary electrical signal,
        (iii) means for processing said digital representation of said first electrical signal and said digital representation of said supplementary electrical signal and for forming at least one electrical parameter output signal, and
        (iv) means for displaying said at least one electrical parameter output signal.

2. The device as recited in claim 1, wherein said electromagnetic waves are radio frequency waves.

3. The device as recited in claim 1, wherein said means for transmitting said digital representation of said supplementary electrical signal transmits said digital representation of said supplementary electrical signal using a transmission method selected from a group consisting of frequency shift keying, frequency modulation, phase modulation, and amplitude modulation.

4. The device as recited in claim 1, wherein said means for displaying said at least one electrical parameter output signal is digitally displayed.

5. The device as recited in claim 1, wherein said means for displaying said at least one electrical parameter output signal comprises a voltage display assembly, wherein said at least one electrical parameter output signal is used to provide an indication on said voltage display assembly of the AC Voltage being carried between two electrical test points.

6. The device as recited in claim 1, wherein said means for transmitting said digital representation of said supplementary electrical signal comprises:
    (a) a modulator; and
    (b) a transmitter.

7. The device as recited in claim 1, wherein said means for receiving said digital representation of said supplementary electrical signal comprises:

(a) a demodulator; and (b) a receiver.

8. The device as recited in claim 1, further comprising electrical shielding, said electrical shielding in electrical communication with said first electrical signal and said supplementary electrical signal.

9. The device as recited in claim 1, wherein said at least one electrical output signal can provide an indication of measured voltages in the range from 0 VAC to about 750,000 VAC.

10. A multimeter, comprising:

a master module;

a supplemental module, said supplemental module and said master module being in wireless communication;

electrical circuitry carried by said master module for determining phase difference and phase sequence between two electrical conductors;

means carried by said master module for displaying said phase difference and phase sequence when said electrical circuitry determines said phase difference and phase sequence of said two electrical conductors;

a first test probe in electrical connection with said master module; and a second test probe in electrical connection with said supplemental module, said first and said second test probes, when placed in contact with electrical conductors, being adapted to generate first and second signals, respectively, said supplemental module communicating wirelessly said signal from said second test probe to said master module, said master module receiving said second signal from said second test probe via said supplemental module and receiving said first signal from said first test probe.

11. The multimeter as recited in claim 10, further comprising means for alleviating the effects of capacitive charging current when said electrical circuitry determines said phase difference and phase sequence of said two conductors.

12. The multimeter as recited in claim 10, wherein said supplemental module converts said second signal to a digital signal before communicating said second signal to said master module.

13. The multimeter as recited in claim 10, wherein said electrical circuitry, in determining phase difference and phase sequence, compensates for wireless communication of said second signal.

14. The multimeter as recited in claim 10, wherein said first test probe is attached to said master module.

15. The multimeter as recited in claim 10, wherein said displaying means displays said phase difference digitally.

* * * * *